US009362123B2

(12) United States Patent
Yao et al.

(10) Patent No.: US 9,362,123 B2
(45) Date of Patent: Jun. 7, 2016

(54) STRUCTURE AND METHOD FOR INTEGRATED DEVICES ON DIFFERENT SUBSTARTES WITH INTERFACIAL ENGINEERING

(71) Applicant: Taiwan Semiconductor Manufacturing Company, Ltd., Hsin-Chu (TW)

(72) Inventors: Liang-Gi Yao, Shin Chu (TW); I-Ming Chang, Shin Chu (TW); Yasutoshi Okuno, Soraku-gun (JP); Chih-Hao Chang, Chu-Bei (TW); Shou Zen Chang, Panchiao (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 41 days.

(21) Appl. No.: 13/725,330

(22) Filed: Dec. 21, 2012

(65) Prior Publication Data

US 2014/0175513 A1    Jun. 26, 2014

(51) Int. Cl.
*H01L 21/20* (2006.01)
*H01L 29/78* (2006.01)
*H01L 27/12* (2006.01)
*H01L 21/28* (2006.01)
*H01L 29/66* (2006.01)
*H01L 29/10* (2006.01)
(Continued)

(52) U.S. Cl.
CPC ........ *H01L 21/2807* (2013.01); *H01L 29/1054* (2013.01); *H01L 29/66545* (2013.01); *H01L 29/785* (2013.01); *H01L 21/02381* (2013.01); *H01L 21/02532* (2013.01); *H01L 29/513* (2013.01); *H01L 29/517* (2013.01); *H01L 29/66651* (2013.01)

(58) Field of Classification Search
CPC .......... H01L 21/20; H01L 29/78; H01L 27/12
USPC .................................................. 257/438, 192
See application file for complete search history.

(56) References Cited

U.S. PATENT DOCUMENTS 7,531,437 B2    5/2009   Brask et al.
8,796,695 B2 *  8/2014   Liao .................. H01L 29/66484
                                                       257/190

(Continued)

OTHER PUBLICATIONS

G.S. Oehrlein et al., "Interactive Effects in the Reactive ION Etching of SiGe Alloys," AIP Advances Special Topic Section: Physics of Cancer, Appl. Phys. Lett. 58 (20, May 20, 1991, 1991 American Institute of Physics, 4 pages.

(Continued)

*Primary Examiner* — Marc Armand
*Assistant Examiner* — Quinton Brasfield
(74) *Attorney, Agent, or Firm* — Haynes and Boone, LLP

(57) ABSTRACT

The present disclosure provides one embodiment of a semiconductor structure. The semiconductor structure includes a semiconductor substrate having a first semiconductor material and a first reactivity; and a low reactivity capping layer of disposed on the semiconductor substrate, wherein the low reactivity capping layer includes a second semiconductor material and a second reactivity less than the first reactivity, the low reactivity capping layer includes silicon germanium $Si_{1-x}Ge_x$ and x is less than about 30%.

12 Claims, 5 Drawing Sheets

(51) Int. Cl.
*H01L 21/02* (2006.01)
*H01L 29/51* (2006.01)

(56) References Cited

U.S. PATENT DOCUMENTS

| | | | | |
|---|---|---|---|---|
| 2006/0237791 A1* | 10/2006 | Doris | ............... | H01L 29/66545 257/348 |
| 2007/0161196 A1* | 7/2007 | Currie | ............... | H01L 21/0237 438/287 |
| 2009/0075445 A1* | 3/2009 | Kavalieros | ...... | H01L 21/823807 438/300 |
| 2009/0130826 A1* | 5/2009 | Kim | ............... | H01L 21/02381 438/478 |
| 2009/0170251 A1* | 7/2009 | Jin et al. | ............... | 438/197 |
| 2010/0200937 A1* | 8/2010 | Bedell | ............... | H01L 29/7833 257/410 |
| 2010/0213477 A1* | 8/2010 | Xu | ............... | H01L 33/0041 257/94 |
| 2012/0032230 A1* | 2/2012 | Yin | ............... | H01L 29/1054 257/192 |
| 2014/0027816 A1* | 1/2014 | Cea et al. | ............... | 257/192 |

OTHER PUBLICATIONS

G. Katsaros et al., "Investigating the Lateral Motion of SIGE Islands by Selective Chemical Etching," 2006 Elsevier B.V., pp. 2608-2613, Surface Science 600.

* cited by examiner

STRUCTURE AND METHOD FOR INTEGRATED DEVICES ON DIFFERENT SUBSTARTES WITH INTERFACIAL ENGINEERING

BACKGROUND

Integrated circuits have progressed to advanced technologies with smaller feature sizes, such as 32 nm, 28 nm and 20 nm. In these advanced technologies, new structure or new material may be implemented. In one example, field-effect transistors (FETs) include three dimensional transistors each having a fin-like FET (FinFET) structure for enhanced device performance. In another example, different semiconductor material (such as silicon germanium) is incorporated for device enhancements, such as strain effect to increase the carrier mobility. In another example, the gate stacks in the FETs include metal for metal electrodes and high-k dielectric material for gate dielectric. However, existing methods and structures have various concerns and disadvantages associated with device performance and reliability. For example, substrate surface damages are introduced during integrated fabrication. The substrate surface damage may further induce high leakage and degraded device performance.

Therefore, there is a need for a structure and method for an integrated circuit to address these concerns for enhanced performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
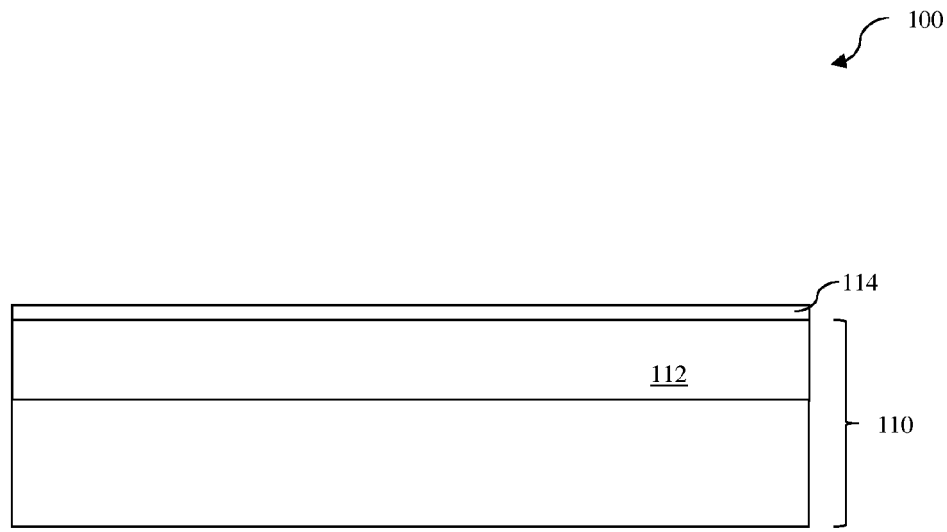
FIGS. 1-6 are cross-sectional views of a semiconductor structure at various fabrication stages constructed according to one embodiment of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, a semiconductor structure 100 is shown according to one embodiment of the present invention. The semiconductor structure 100 includes a substrate 110. In the present embodiment, the substrate 110 includes germanium (Ge) or a compound semiconductor such as silicon germanium (SiGe), silicon carbide, gallium arsenic, indium arsenide, indium phosphide, or other III-V group semiconductor. The substrate 110 may be doped with P-type or N-type dopant.

In one embodiment, the substrate 110 includes a semiconductor layer 112 of a first semiconductor material, such as SiGe, Ge, III-V group semiconductor material, formed on a silicon substrate or other suitable substrate. In the present embodiment, the first semiconductor material in the semiconductor layer 112 includes $Si_{1-x}Ge_x$. The parameter x is greater than 40% in the present example. In one embodiment, the semiconductor layer 112 is formed by epitaxy growth on a crystalline substrate, such as a crystalline silicon substrate.

The semiconductor layer 112 is doped by N-type dopant (such as phosphorus or arsenic) or P-type dopant (such as boron). In one embodiment, the semiconductor layer 112 has a dopant concentration ranging between about $10^{12}$ $cm^{-3}$ and about $5 \times 10^{18}$ $cm^{-3}$. The doping may be implemented using a process such as ion implantation or diffusion in various steps and techniques. The first semiconductor material in the semiconductor layer 112 will be further described later.

In one embodiment, the substrate 110 includes a plurality of isolation features, such as shallow trench isolation (STI) to define various regions for making image sensors, various transistors, and other functional features. The shallow trench isolation features may be formed by a suitable technique known in the art. For example, the STI features may be formed by a set of processes including patterning the semiconductor layer by a conventional photolithography, etching the semiconductor layer by a plasma etching process to form various trenches, and filling the trenches by a dielectric material such as silicon oxide by a chemical vapor deposition (CVD) process. The CVD process may utilize high density plasma CVD (HDPCVD) to achieve a better planar surface of the STI features. In the present embodiment, the isolation features are formed in the semiconductor layer 112 and may be further extended to other semiconductor layers underlying the semiconductor layer 112. Various doped wells, such as n-type wells and p-type wells, may be formed in the semiconductor layer 112 by suitable techniques, such as ion implantation or diffusion.

The semiconductor structure 100 includes a low reactivity capping layer 114 of a second semiconductor material disposed on the substrate 110. In the particular embodiment, the low reactivity capping layer 114 is disposed on the semiconductor layer 112. The second semiconductor material is different from the first semiconductor material. Especially, the first semiconductor material has a first reactivity and the second semiconductor material has a second reactivity less than the first reactivity. The reactivity of a material is defined as the rate at which a material tends to undergo a chemical reaction. In various examples, the reactivity of a semiconductor material is related to chemical reactions with chemicals including etching chemical and cleaning chemical used in subsequent etching and cleaning processes. The second semiconductor material has a lower reactivity and less loss during etching or cleaning process.

It is found that the reactivity of silicon germanium is related to the composition. When Germanium is less in silicon germanium, the reactivity is decreased. Accordingly, the resistance to etch is higher. It is further found that the etch rate of the silicon germanium in various dry etch processes (such as $CF_4$, HBr or $CF_2Cl_2$) substantially decreases when the germanium concentration is less than about 20%. It is also found that the etch rate of the silicon germanium in various wet etch processes (such as a wet etchant of $NH_4OH$ and $H_2O_2$) substantially decreases when the germanium concentration is less than about 30%. Accordingly, the low reactivity capping layer 114 is chosen with a composition in a range such that the corresponding etch resistance of the low reactivity capping layer is substantially high in the subsequent etch and cleaning processes, especially the etch and cleaning processes to remove the dummy gates, which are to be discussed later.

In the present embodiment, the second semiconductor material in the low reactivity capping layer 114 includes $Si_{1-y}Ge_y$, where y is less than x. In one embodiment, the parameter y is less than 30% and the parameter x is greater than 40%. In another embodiment, x is about 50% and y is less than about 20%. In yet another embodiment, the low reactivity capping layer 114 is a silicon layer. In this case, y is zero.

Various semiconductor devices are formed in the substrate 110, particularly, in the semiconductor layer 112. During the formation of the devices, such as field-effect transistors (FETs), various fabrication processes are implemented, such as etching, cleaning and oxidation for examples. Due to the high reactivity of the first semiconductor material in the semiconductor layer 112, various damages, material loss, and/or surface roughness are introduced by those fabrication operations, such as oxidation, etching and cleaning. The device performance and reliability are degraded accordingly. For example, a leakage issue may be introduced thereby.

The low reactivity capping layer 114 is formed on the substrate 110 as a protection layer to protect the substrate 110 (or the semiconductor layer 112 in the present embodiment) from damage, material loss and surface roughing since the low reactivity capping layer 114 has a lower reactivity.

Accordingly, the low reactivity capping layer 114 has a proper thickness that is thick enough to effectively protect the substrate 110 and but not too thick to degrade the device performance and increase the fabrication cost. In the present embodiment, the thickness of the low reactivity capping layer 114 is less than about 2 nm.

The low reactivity capping layer 114 is formed by a suitable technique. In one embodiment, the low reactivity capping layer 114 is formed by a CVD process designed to be operable to tune the composition of the low reactivity capping layer 114. In the present embodiment, the CVD process is operable to form the low reactivity capping layer 114 of $Si_{1-y}Ge_y$ such that y is less than 30%. In another embodiment, the low reactivity capping layer 114 may be formed by other suitable technology, such as epitaxy growth by hydride vapor phase Epitaxy (HVPE) or molecular beam epitaxy (MBE).

Figure 2:
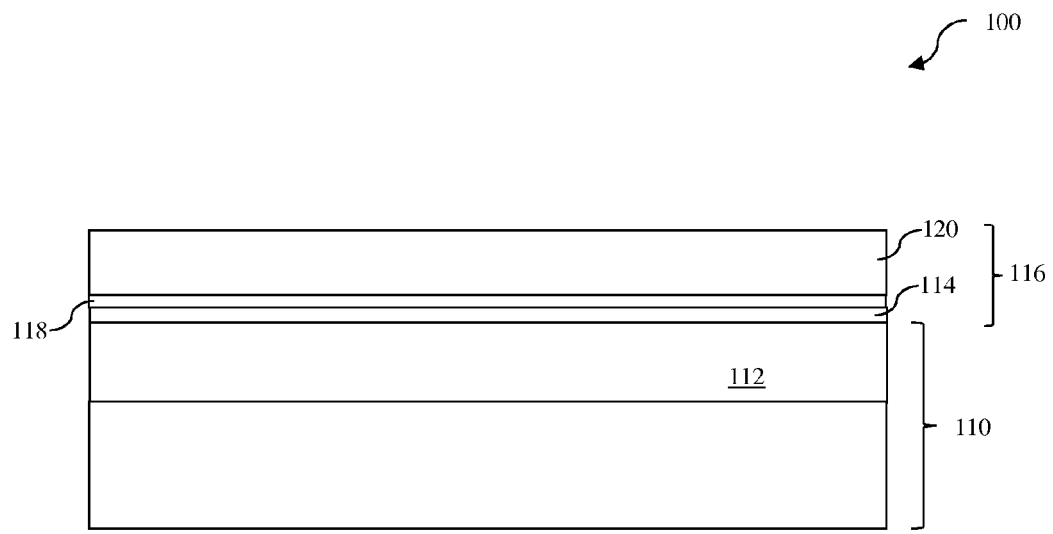

Referring to FIG. 2, gate material layers 116 are deposited on the low reactivity capping layer 114. The gate material layers 116 includes a gate dielectric material 118 disposed on the low reactivity capping layer 114 and a gate electrode material 120 on the gate dielectric material 118. The gate dielectric material 118 includes one or more dielectric material. In one example, the gate dielectric material 118 may include a silicon oxide layer and a high-k dielectric material layer on the silicon oxide layer. The gate electrode material 120 includes one or more conductive material. In one example, the gate electrode material layer 120 may include a metal, doped polysilicon, silicide, other suitable conductive material or combinations thereof.

In one embodiment, the gate dielectric material 118 includes a high-k dielectric material. The high-k dielectric material includes a dielectric material having the dielectric constant higher than that of thermal silicon oxide, which is about 3.9. In one example, the high-k dielectric material includes hafnium oxide (HfO). In various examples, the high-k dielectric material includes metal oxide, metal nitride, or combinations thereof. In one example, the gate dielectric material 118 of high k dielectric material may be formed by CVD, atomic layer deposition (ALD), plasma enhanced CVD (PECVD), or plasma enhanced ALD (PEALD).

In another embodiment, the gate dielectric material 118 further includes an interfacial layer (IL) disposed between the high-k dielectric material layer and the low reactivity capping layer 114. In one example, the interfacial layer includes silicon oxide formed by a suitable technique, such as thermal oxidation. The interfacial layer may be formed by other technique, such as ALD or CVD. In one example, it may be formed by a wet process, such as chemical oxide.

The gate materials 116 may further include a capping layer disposed on the gate dielectric material 118. The capping layer prevents the metal diffusion from gate electrodes to the gate dielectric layer and/or includes one of the materials to form a work function material for the corresponding FET, such as n-type FETs (nFET) or p-type FET (pFET).

In one embodiment, the gate electrode material 120 includes a metal material chosen to have a proper work function for the corresponding FET, such as nFET or pFET, also referred to as n work function metal (or n metal) or p metal, respectively. The metal material may be deposited by physical vapor deposition (PVD) or other suitable process. The gate electrode material may additionally or alternatively include polysilicon (or amorphous silicon) formed by CVD with precursor silane (SiH4) or other silicon based precursor.

Figure 3:
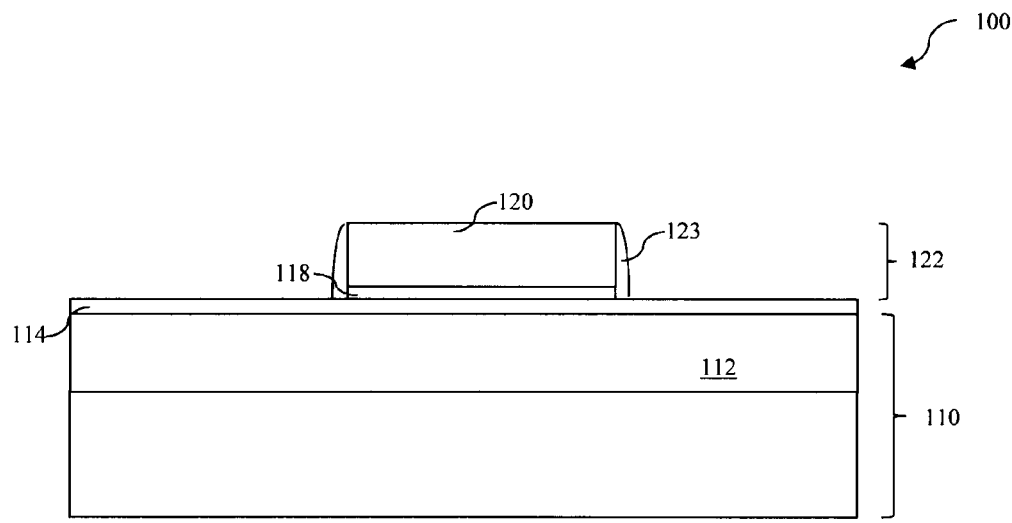

Referring to FIG. 3, the gate materials 116 are patterned to form a gate stack 122 using lithography and etching. A cleaning process may be implemented thereafter. In one embodiment, the gate electrode material 118 and the gate electrode material 120 are patterned. Since the semiconductor layer 112 is protected by the low reactivity capping layer 114, the damage and other issues related to the semiconductor layer 114 is eliminated.

First, a mask layer is formed on the gate materials 116 and is patterned with various openings that define regions where the gate materials are to be removed by the etching. In one embodiment, the mask layer is a hard mask and includes a dielectric material, such as silicon nitride (SiN), silicon oxide (SiO), silicon oxynitride (SiON) or a combination thereof. In one example, the hard mask is deposited by a CVD process or other suitable technique. The hard mask is patterned by a procedure including a lithography process and an etching process. In one example, a patterned resist layer is formed on the hard mask using a photolithography process including resist coating, soft baking, exposing, post-exposure baking (PEB), developing, and hard baking. Then, the hard mask is etched through the openings of the patterned resist layer, forming a patterned hard mask by the etching process. The patterned resist layer may be removed thereafter using a suitable process, such as wet stripping or plasma ashing. In one example, the etching process includes applying a dry (or plasma) etch to remove the hard mask within the openings of the patterned resist layer. In another example, the etching process includes applying a wet etch to remove the hard mask layer within the openings of the patterned resist layer. In another embodiment, the mask layer includes a resist material and a patterned resist layer is directly used as a mask layer. Resist material is sensitive to photons and resists to etch. In the present embodiment of the lithography process, a photomask is used. The mask includes a pattern having various features and defining various regions for one or more gate stacks. The photomask and the corresponding lithography process may utilize a suitable technology. In one example, the photomask is a binary photomask that includes a transparent substrate (of fused quartz in one example) and an opaque layer (of chromium in one example) disposed on the transparent substrate. The opaque layer is patterned to define the regions for gate stacks. In other examples, the photomask may include a phase shift mask (PSM), or other suitable photomask. In another embodiment, a lithography process may employ other suitable technologies, such as electron-beam (e-beam), to form a patterned resist layer. In this case, the resist material is sensitive to electrons. The photomask is eliminated and the resist layer is exposed in an e-beam direct write mode according to a pattern defined in a database. Other alternatively used lithography process may include ion lithography process or molecular imprint.

Then, an etch process is performed to selectively etch the gate materials within the openings of the mask layer to form the gate stack 122. The etch process may include dry etch, wet etch, or both. For example, the etch process may include one etch step (such as dry) to pattern various gate materials. In another example, the etch process may include multiple etch steps with different etching chemicals to etch the gate materials, respectively. It is noted that only one gate stack 122 is illustrated in FIG. 3, but a plurality of gate stacks may be formed by the above operations. During the etch process to pattern the gate stack 122, the material loss in the active region is reduced or eliminated since the low reactivity capping layer 114 is present to effectively protect the active region from etching.

After the formation of the gate stack 122, source and drain are formed in the semiconductor layer by one or more ion implantation of p-type dopant (such as boron) or n-type (such as phosphorous). In one embodiment, the source and drain include light doped drain (LDD) features and heavily doped source and drain (S/D) features. In one embodiment, the LDD features are formed by one ion implantation; the gate spacers (such as gate spacers 123 shown in FIG. 3) are formed on the sidewalls of the gate stack 122; then heavily doped S/D features are formed by another ion implantation. A thermal annealing process may follow for activation. Specifically, source and drain are formed on two sides of the gate stack 122.

In another embodiment, the gate stack 122 is a dummy gate stack and is replaced by a gate stack of high-k dielectric material and metal in a replacement gate (RPG) process. In this case, the dummy gate may include silicon oxide and polysilicon. The RPG process is further described below.

Figure 4:
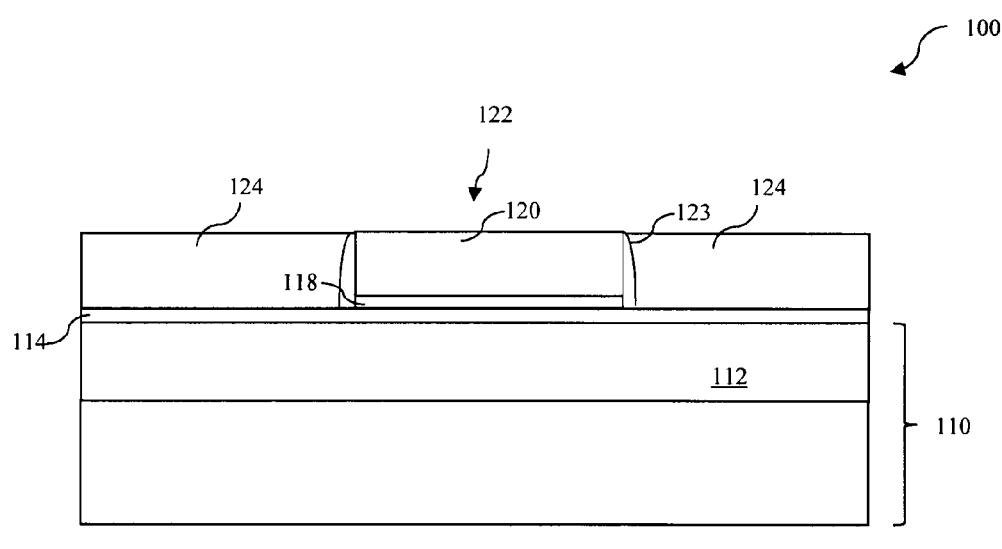

Referring to FIG. 4, an interlayer dielectric (ILD) material layer 124 is deposited on the substrate by a suitable technique, such as CVD. In the present case, the ILD material layer 124 is disposed on the low reactivity capping layer and the gate stack 122. A polishing process, such as chemical mechanical polishing (CMP), may be implemented to remove the ILD material layer on the gate stack 122 such that the gate stack 122 is uncovered. The CMP process also planarizes the top surface of the ILD layer over the substrate.

Figure 5:
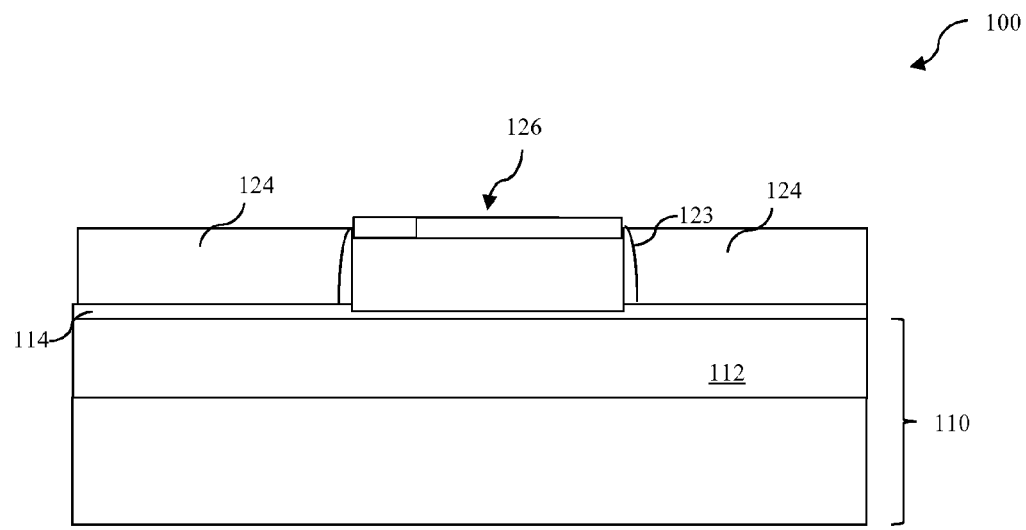

Referring to FIG. 5, the gate stack 122 is selectively removed by an etch process, resulting in a gate trench 126. The etch process may include dry etch, wet etch or combination thereof. In one example, a mask layer is used as an etch mask such that the gate stack 122 is selectively removed through the opening of the mask layer. The mask layer is formed on the ILD layer and is patterned to have an opening where the gate stack 122 is uncovered. The mask layer is similar to the mask layer used to pattern the gate materials 116 in terms of material and formation. In one example, the mask layer may be a hard mask layer formed a procedure including deposition, lithography process and etching. In another example, the mask layer is a patterned resist layer. In one example, the low reactivity capping layer 114 is partially removed and a recess of the low reactivity capping layer 122 is formed in the gate trench 126.

During the etch process to remove the dummy gate, the material loss, surface roughness and damage may be introduced in the channel region, causing the degradation of the device performance. With the low reactivity capping layer 114 disposed on the semiconductor layer 112, the semiconductor layer 112 is effectively protected and various damages to the semiconductor layer 112 are substantially reduced (or eliminated).

In one embodiment, the gate replacement process further includes a cleaning process after the etch process. In various examples, the solution used in cleaning process includes an ammonia-hydrogen peroxide-water mixture (SC-1), a hydrochloric acid-hydrogen peroxide-water mixture (SC-2) or both.

It is found that the cleaning process introduces additionally material loss, surface roughness and damage to the semiconductor layer 112, causing the degradation of the device performance, when the semiconductor layer 112 is directly exposed to the cleaning and etch processes. Again, the low reactivity capping layer 114 effectively protects the semiconductor layer 112 from such damage and loss caused by the cleaning process.

Figure 6:
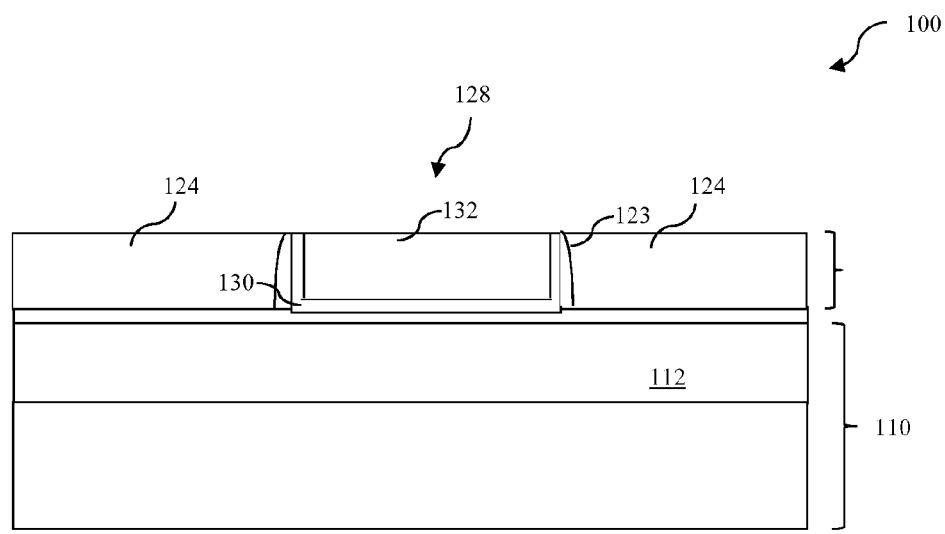

Referring to FIG. 6, a gate stack 128 is formed in the gate trench 126. The gate stack 128 is formed by a procedure including deposition and polishing (such as CMP to remove the excessive gate materials deposited on the ILD material layer 124). In one embodiment where the low reactivity capping layer 114 is recessed in the gate trench 126, the gate stack 128 is extends in the low reactivity capping layer 114 and partially embedded therein.

In the present embodiment, the gate stack 128 includes high-k dielectric material and metal. In furtherance of the embodiment, the gate stack 128 includes a gate dielectric material 130 disposed on the low reactivity capping layer 114 and on the sidewalls of the gate trench 126. The gate stack 128 includes a gate electrode material 132 on the gate dielectric material 130. The gate dielectric material 130 includes high-k dielectric material. In one example, the gate dielectric material 130 includes an interfacial layer of silicon oxide layer and a high-k dielectric material layer on the interfacial layer. The gate electrode material 132 includes one or more conductive material. In one example, the gate electrode material layer 132 includes a metal and may further include silicide or other suitable conductive material.

In one example, the gate dielectric material 130 of high k dielectric material may be deposited by CVD, ALD, PECVD or PEALD. In another embodiment, the gate electrode material 132 is deposited by PVD or other suitable technique.

In an alternative embodiment of the gate-first replacement gate (RPG) process, the gate stack 122 may not be completely replaced. For example, the gate dielectric material in the gate stack 122 is not removed and replaced. Only the gate electrode material in the gate stack 122 is removed and replaced.

Another embodiment of the gate-last RPG process, wherein the gate stack 122 is replaced, is provided and described with reference to FIGS. 7 through 9.

Figure 7:
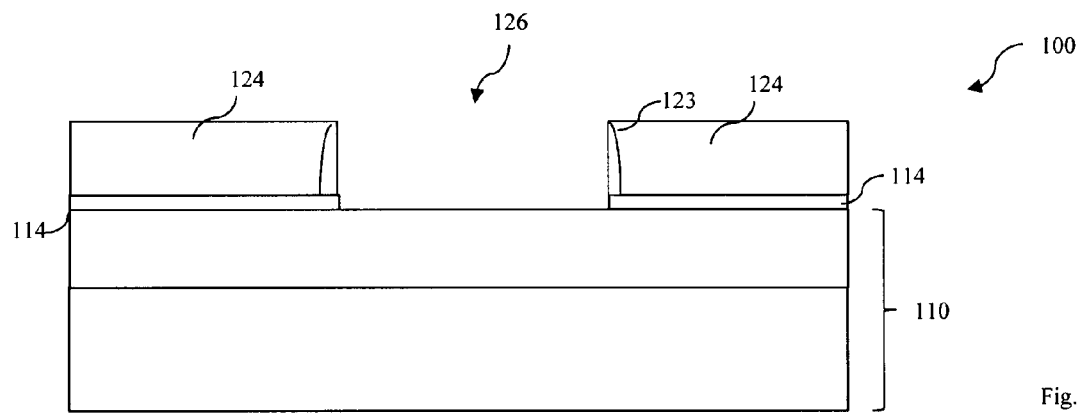
FIGS. 7-9 are cross-sectional views of a semiconductor structure at various fabrication constructed according to aspects of the present disclosure in another embodiment.

Referring to FIG. 7, the gate stack 122 is selectively removed by an etch process, resulting in a gate trench 126. The etch process may include dry etch, wet etch or combination thereof. In one example, a mask layer is used as an etch mask such that the gate stack 122 is selectively removed through the opening of the mask layer. The mask layer is formed on the ILD layer and is patterned to have an opening where the gate stack 122 is uncovered. The mask layer is similar to the mask layer used to pattern the gate materials 116 in terms of material and formation. In one example, the mask layer may be a hard mask layer formed a procedure including deposition, lithography process and etching. In another example, the mask layer is a patterned resist layer.

The low reactivity capping layer 114 is partially removed or substantially removed within the gate trench 126, by the etch process to remove the gate stack 122 in the present example.

Figure 8:
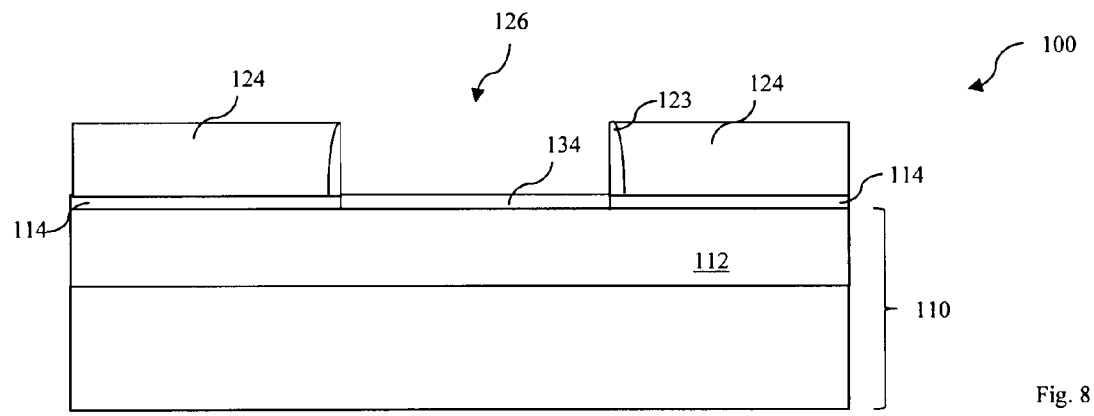

Referring to FIG. 8, a semiconductor layer 134 is formed in the gate trench by a suitable technique, such as the technique used to form the low reactivity capping layer 114. The semiconductor layer 134 is similar to the low reactivity capping layer 114. In the present embodiment, the semiconductor layer 134 includes silicon germanium. In the present embodiment, the semiconductor layer 134 includes $Si_{1-z}Ge_z$, where z is less than 30%. In another embodiment, the semiconductor layer 134 is different from the low reactivity capping layer 114 in composition. For example, z is about 30% and y is about 25%. In one embodiment, the semiconductor layer 134 has a thickness equal to the thickness of the low reactivity capping layer 114. In another embodiment, the semiconductor layer 134 has a proper thickness such that the semiconductor layer 134 is substantially coplanar with the low reactivity capping layer 114 at top surface.

Figure 9:
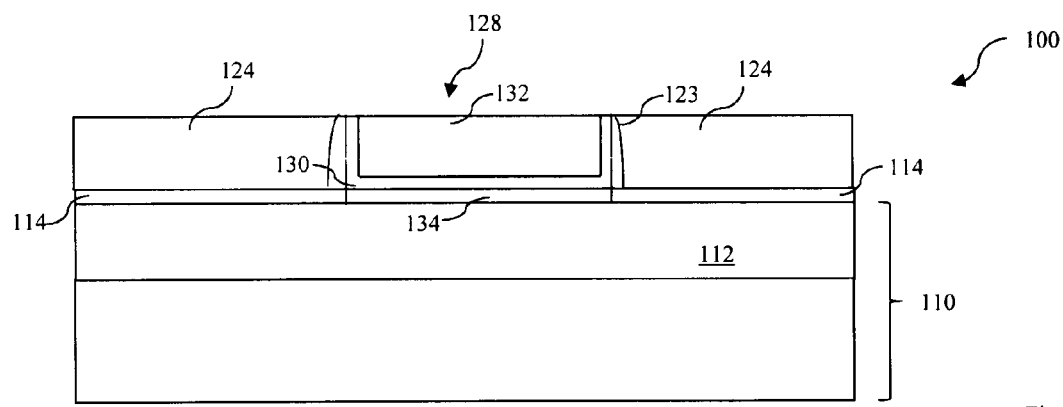

Referring to FIG. 9, a gate stack 128 is formed on the semiconductor layer 134 within the gate trench 126. The gate stack 128 is formed by a same procedure of FIG. 6. For example, the gate stack 128 is formed by a procedure including deposition and CMP. In the present embodiment, the gate stack 128 includes high-k dielectric material and metal. In furtherance of the embodiment, the gate stack 128 includes a gate dielectric material 130 of high-k dielectric material disposed on the semiconductor layer 134 and on the sidewalls of the gate trench 126. In one example, the gate dielectric material 130 includes an interfacial layer of silicon oxide layer and a high-k dielectric material layer on the interfacial layer.

Thus, other circuit features, such as contacts, may be further formed. In another embodiment, the substrate includes a fin-like active region extruded from the substrate. Accordingly, the FET is formed on the fin-like active region and is referred to as a FinFET. The corresponding semiconductor structure 150 having a FinFET is described with reference to FIGS. 10 and 11 in sectional views. The semiconductor structure 150 is similar to the semiconductor structure 100. For example, the semiconductor structure 150 includes the low reactivity capping layer. However, the low reactivity capping layer is formed on the fin-like active region. The similar features and descriptions are not repeated for simplicity.

Figure 10:
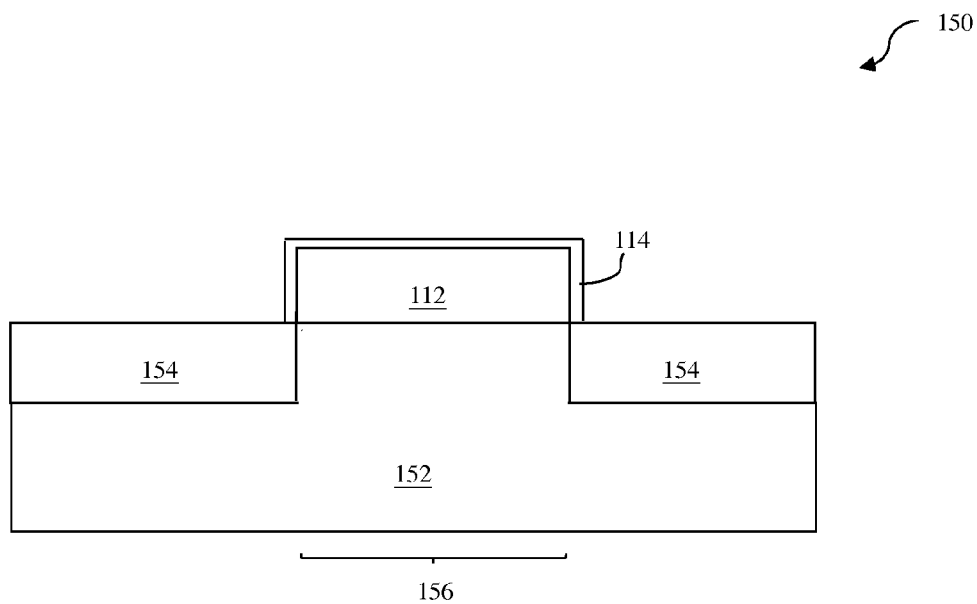
FIGS. 10-11 are cross-sectional views of a semiconductor structure at various fabrication constructed according to aspects of the present disclosure in another embodiment.

Particularly, as illustrated in FIG. 10, the semiconductor structure 150 includes the substrate 152 that includes a semiconductor material. In the present embodiment, the substrate 152 includes silicon. The semiconductor structure 150 further includes STI features 154 that are formed in the substrate 152 and define one or more active region 156. In one embodiment, the semiconductor structure 150 includes a semiconductor layer 112 formed by epi growth on a silicon substrate or other suitable substrate 152. In the present embodiment, the semiconductor layer 112 is epi grown after removing portions of silicon fin-like features in the previously formed FinFET structure having STI features 154 formed using suitable CMP to planarize. STI recess and gate stack (or dummy gate stack) are then formed. RPG FinFET structure is formed accordingly, and the fin-like active region 156 is exposed after removing dummy poly by patterning and etching processes.

Still referring to FIG. 10, the low reactivity capping layer 114 is formed on the semiconductor layer 112 and the fin-like active region 156. Especially, the low reactivity capping layer 114 is disposed on the top surface and sidewalls of the fin-like active region 156. The low reactivity capping layer 114 is similar to the low reactivity capping layer 114 of FIG. 1 in terms of composition and formation.

Figure 11:
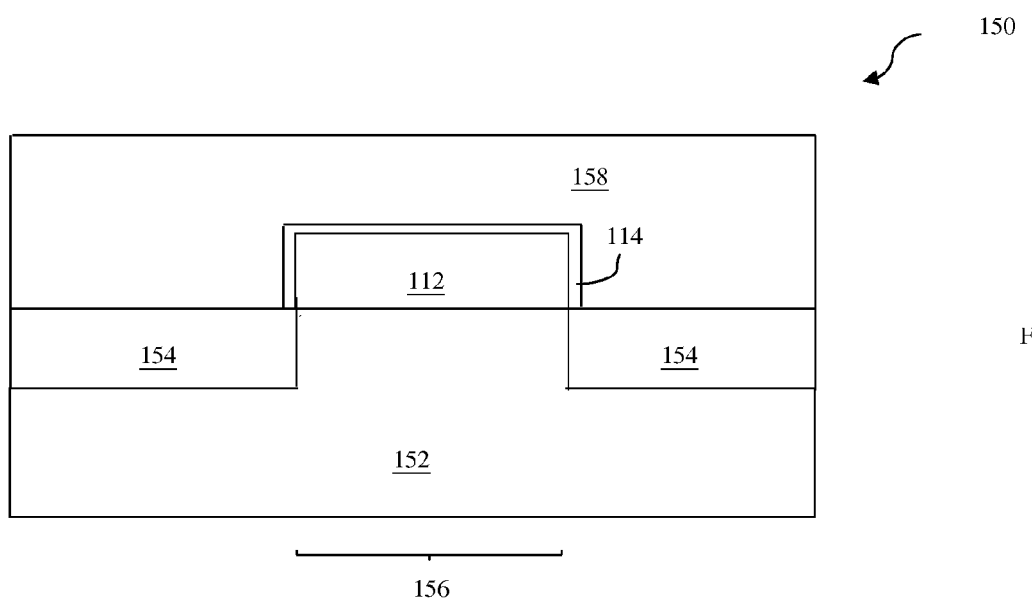

Referring to FIG. 11, a gate stack 158 is formed on the fin-like active region 156. The gate stack 158 is disposed on the top surface and sidewalls of the fin-like active region 156. In one embodiment, the gate stack 158 is similar to the gate stack 122 in terms of composition and formation. In another embodiment, the gate stack 158 is similar to the gate stack 128 in terms of composition and formation.

Other features may also be present. For example, a multilayer interconnect (MLI) structure and dielectric layers separating the MLI structure are formed and configured with proper connections to form designed circuit. The MLI structure includes various contacts, vias and metal lines. In one embodiment, the MLI may include conductive materials such as aluminum, aluminum/silicon/copper alloy, titanium, titanium nitride, tungsten, polysilicon, metal silicide, or combinations, referred to as aluminum interconnects. Aluminum interconnects may be formed by a process including physical vapor deposition (or sputtering), chemical vapor deposition (CVD), or combinations thereof. In alternative embodiment, a copper multilayer interconnect may be used and include copper, copper alloy, titanium, titanium nitride, tantalum, tantalum nitride, tungsten, polysilicon, metal silicide, or combinations. The copper multilayer interconnect may be formed by a technique such as CVD, sputtering, plating, or other suitable processes.

Thus, the present disclosure provides one embodiment of a semiconductor structure. The semiconductor structure includes a substrate having a first semiconductor material layer with a first reactivity; and a low reactivity capping layer disposed on the substrate. The low reactivity capping layer has a second reactivity less than the first reactivity. The low reactivity capping layer includes silicon or silicon germanium $Si_{1-x}Ge_x$ with x less than about 30%.

In one embodiment, the first semiconductor material layer is selected from the group consisting of germanium, silicon germanium, a III-V group semiconductor material, and a combination thereof.

In another embodiment, the first semiconductor material layer directly contacts the low reactivity capping layer; and the first semiconductor material includes silicon germanium $Si_{1-y}Ge_y$, and y is greater than about 40%. In another embodiment, y is about 50%; and x is less than about 20%.

In yet another embodiment, the semiconductor substrate includes a fin-like active region and the low reactivity capping layer is disposed on top surface and sidewalls of the fin-like active region.

In yet another embodiment, the semiconductor structure further includes a gate stack disposed on the low reactivity capping layer and partially embedded in the low reactivity capping layer.

In yet another embodiment, the gate stack includes a gate dielectric feature disposed on the low reactivity capping layer and a gate electrode disposed on the gate dielectric feature, and the gate dielectric feature includes a high-k dielectric material and the gate electrode includes a metal material.

The present disclosure also provides another embodiment of a semiconductor structure. The semiconductor structure includes a substrate; a first semiconductor layer disposed on the substrate, wherein the first semiconductor layer includes silicon germanium $Si_{1-x}Ge_x$ and x is greater than about 40%; and a second semiconductor layer disposed on the first semiconductor layer, wherein the second semiconductor layer includes one of silicon and silicon germanium $Si_{1-y}Ge_y$ with y less than about 30%.

In one embodiment, the substrate is a silicon substrate. In another embodiment, x is about 50%; and y is less than about 20%. In yet another embodiment, the semiconductor structure further includes a gate stack disposed on the second semiconductor layer, wherein the gate stack includes a gate dielectric feature disposed on the second semiconductor layer and a gate electrode disposed on the gate dielectric feature, and the gate dielectric feature includes a high-k dielectric material and the gate electrode includes a metal material.

In yet another embodiment, the gate dielectric feature further includes an interfacial layer of silicon oxide disposed between the second semiconductor layer and the high-k dielectric material.

In yet another embodiment, the gate stack extends into the second semiconductor layer. In yet another embodiment, the second semiconductor layer includes a first portion directly covered by the gate stack and a second portion uncovered by the gate stack, wherein the first portion of the second semiconductor layer is different from the second portion of the second semiconductor layer in composition. In yet another embodiment, the second semiconductor layer has a thickness less than about 2 nm.

The present disclosure also includes one embodiment of a method for fabricating an integrated circuit. The method includes forming a first semiconductor layer on a substrate, wherein the first semiconductor layer includes silicon germanium $Si_{1-x}Ge_x$ and x is greater than about 40%; and forming a second semiconductor layer on the first semiconductor layer, wherein the second semiconductor layer includes silicon germanium $Si_{1-y}Ge_y$ and y is less than about 30%.

In one embodiment, the method further includes depositing gate material layers on the second semiconductor layer; and patterning the gate material layers to form a first gate stack.

In another embodiment, the method further includes forming an interlayer dielectric (ILD) layer on the second semiconductor layer; performing an etching process and a cleaning process to remove the first gate stack, resulting in a trench in the ILD layer; and forming a second gate stack in the trench.

In yet another embodiment, the method, before the forming of the second gate stack, further includes etching the second semiconductor layer in the trench; and forming a third semiconductor layer in the trench.

In yet another embodiment, the forming of the second gate stack includes forming a high-k dielectric material layer; and forming a metal layer on the high-k dielectric material layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
a first semiconductor layer disposed on the substrate, wherein the first semiconductor layer includes silicon germanium Si1-xGex and x is greater than about 40%, wherein the first composition interfaces the substrate and an overlying second semiconductor layer; and
a second semiconductor layer disposed on the first semiconductor layer, wherein the second semiconductor layer has a second composition of silicon germanium $Si_{1-y}Ge_y$ with y being less than about 30%, wherein the second composition interfaces the first semiconductor layer and a dielectric material;
a third semiconductor layer disposed on the first semiconductor layer and adjacent the second semiconductor layer, wherein the third semiconductor layer has a third composition of $Si_{1-z}Ge_z$ wherein z is different than y, wherein the third composition interfaces the first semiconductor layer and a gate stack;
the gate stack disposed on the third semiconductor layer such that at least one layer of the gate stack has an interface with the third composition; and
the dielectric material laterally adjacent the gate stack and the disposed on the second semiconductor layer such that the dielectric material has an interface with the second composition.

2. The semiconductor structure of claim 1, wherein the first semiconductor material layer directly contacts the second semiconductor material layer.

3. The semiconductor structure of claim 1, wherein x is about 50%; and y is less than about 20%.

4. The semiconductor structure of claim 1, wherein the gate stack includes a gate dielectric feature disposed on the third composition and the metal gate electrode disposed on the gate dielectric feature, and the gate dielectric feature includes a high-k dielectric material.

5. The semiconductor structure of claim 1, wherein the substrate is a silicon substrate.

6. The semiconductor structure of claim 1, wherein x is about 50%; and y is less than about 20%.

7. The semiconductor structure of claim 1, wherein the second semiconductor layer has a thickness less than about 2 nm.

8. The device of claim 1, wherein the second semiconductor layer has a thickness less than about 2 nm.

9. The semiconductor structure of claim 1, wherein the gate stack includes a gate dielectric feature disposed on the second semiconductor layer and a gate electrode disposed on the gate dielectric feature, and the gate dielectric feature includes a high-k dielectric material and the gate electrode includes a metal material.

10. The semiconductor structure of claim 9, wherein the gate dielectric feature further includes silicon oxide and the high-k dielectric material.

11. The semiconductor structure of claim 9, wherein the gate stack extends into the second semiconductor layer.

12. The semiconductor structure of claim 9, wherein the second semiconductor layer includes a first portion directly covered by the gate stack and a second portion uncovered by the gate stack, wherein the first portion of the second semiconductor layer is different from the second portion of the second semiconductor layer in composition.

* * * * *